(12) United States Patent
Yoshida

(10) Patent No.: US 7,910,478 B2
(45) Date of Patent: Mar. 22, 2011

(54) METHOD OF MANUFACTURING SEMICONDUCTOR DEVICES

(75) Inventor: Katsuji Yoshida, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 0 days.

(21) Appl. No.: 12/628,310

(22) Filed: Dec. 1, 2009

(65) Prior Publication Data

US 2010/0144142 A1 Jun. 10, 2010

(30) Foreign Application Priority Data

Dec. 4, 2008 (JP) .................................. 2008-309765

(51) Int. Cl.
*H01L 21/44* (2006.01)
(52) U.S. Cl. ............... 438/666; 438/613; 257/E21.575
(58) Field of Classification Search .......... 438/612–618, 438/622, 666–668; 257/E21.575
See application file for complete search history.

(56) References Cited

U.S. PATENT DOCUMENTS

2005/0239277 A1* 10/2005 Mercer et al. ................ 438/614

FOREIGN PATENT DOCUMENTS

| JP | 2008-084919 | 4/2008 |
| JP | 2008-244383 | 10/2008 |

* cited by examiner

*Primary Examiner* — Thanhha Pham
(74) *Attorney, Agent, or Firm* — Volentine & Whitt, PLLC

(57) ABSTRACT

A method of manufacturing a semiconductor device, forms connection pads electrically connected to integrated circuit portion formed in a semiconductor substrate, lays an insulating film and a protective film one over another, forms sub-lines electrically connected to the connection pads on the protective film, forms a coating film covering the sub-lines and the protective film, sticks a dry film onto the coating film, forms external connection electrodes externally connectable and electrically connected to the sub-lines, and removes the dry film and forms a sealing layer covering the coating film and side surfaces of the external connection electrodes.

10 Claims, 5 Drawing Sheets

METHOD OF MANUFACTURING SEMICONDUCTOR DEVICES

BACKGROUND OF THE INVENTION

1. Field of the Invention

The present invention relates to a method of manufacturing semiconductor devices, and particularly to a manufacturing method of semiconductor devices called CSPs (Chip Size Packages).

2. Description of the Related Art

In these years, electronic devices such as mobile phones, mobile computers, personal digital assistants (PDAs), home video cameras, and digital cameras, and the peripheral components of the electronic devices are being dramatically reduced in size and weight. In association with this market trend, demands for reduction in size, thickness, and weight and high density mounting onto fine wiring boards of semiconductor chips to be used in electronic devices are increasing. In order to meet these demands, the development of semiconductor devices of package sizes the same as or slightly larger than the chip sizes, so-called CSPs (Chip Size Packages), is attracting attention.

Other than being ultra-small and thin to be close to the chip size, an advantage of the CSPs is that the conventionally known surface mounting technology can be used in mounting them on printed boards. Another advantage of the CSPs is that because a semiconductor chip in a package structure is mounted, mounting of high quality can be ensured as compared with bare chip mounting where a semiconductor chip is directly mounted on a printed board.

In the manufacturing method of semiconductor devices called CSPs, an insulating film and a protective film are formed over a semiconductor wafer on which integrated circuits and connection pads electrically connected to the integrated circuits are formed. Subsequently, portions of the insulating film and the protective film on the connection pads are removed, and redistribution lines (also, referred to as sub-lines or sub-wirings) electrically connected via the connection pads to the integrated circuits are formed. Then, a resist layer having openings is formed, and column-shape protruding electrodes (hereinafter called post bumps) electrically connected to the redistribution lines are formed inside the openings. Further, the resist layer is removed, and the post bumps are covered with a sealing layer made of resin, thereby finishing the production of wafer-level CSPs.

A material in liquid form can be used for the above-mentioned resist layer, but it is very difficult to coat a resist liquid. Accordingly, a dry film structured to have a resin to be solidified by light sandwiched between a polyethylene film and a polyester film is usually used as the resist layer of a large thickness for forming the post bumps.

In order to meet a demand for further reduction in size and thickness, it is becoming essential to make the redistribution line finer. However, as the redistribution line becomes finer, the surface state before the dry film is attached (that is, projections and depressions due to the redistribution lines) becomes less negligible, and thus it becomes more difficult to stick the dry film to be flat. If the dry film fails to be stuck to be flat, wrinkles will occur in the dry film, and thus spaces will be formed between the dry film and the redistribution lines and between the dry film and the protective film. Where such spaces are formed, the problem will occur that plating grows in the spaces as well when a metal plating process is performed to form post bumps, resulting in a short between the redistribution lines.

Further, in the above-described CSPs, the problem may occur that metal ions from the redistribution lines diffuse into the sealing layer (that is, electromigration occurs) because the redistribution lines are covered with the sealing layer of resin, resulting in a short between the redistribution lines.

Japanese Patent Application Laid-Open Publication No. 2008-84919 (Reference 1) discloses a technique which coats liquid resin over redistribution lines by spin coating or the like to form a coating film and coats a dry film over the coating layer to form post bumps. Further, Japanese Patent Application Laid-Open Publication No. 2008-244383 (Reference 2) discloses a technique which forms an anti-electromigration film after forming post bumps.

SUMMARY OF THE INVENTION

However, the techniques disclosed in References 1 and 2 deal with only either of the above two problems, and it was difficult to solve the above two problems at the same time.

The present invention was made in view of the above situation and provides a semiconductor device manufacturing method that can prevent a short between lines in semiconductor devices and provide semiconductor devices with an improvement in yield and high reliability.

In order to solve the above problems, there is provided a method of manufacturing a semiconductor device. The method comprises a connection pad forming step of forming connection pads on a substrate where an integrated circuit portion having a plurality of lines are formed, the connection pads being electrically connected to the integrated circuit portion; a film forming step of forming an insulating film and stacking a protective film on the insulating film to form a stacked structure having connection pad exposing holes to expose portions of said connection pads therethrough; a sub-line forming step of forming sub-lines filling the connection pad exposing holes and covering parts of the exposed surface of the protective film; a coating film forming step of forming a coating film covering the sub-lines and the protective film; a dry film sticking step of sticking a dry film onto the coating film; a through hole forming step of forming through holes extending through the coating film and the dry film to expose parts of the sub-lines; an electrode forming step of forming external connection electrodes filling the through holes; and a sealing layer forming step of removing the dry film and forming a sealing layer covering the coating film and side surfaces of the external connection electrodes.

According to the method of manufacturing a semiconductor device of the present invention, the coating film is formed over the sub-lines electrically connected via the connection pads to the integrated circuit portion formed in the semiconductor substrate, thereby alleviating protrusions and depressions or asperities in the sub-line formed surface due to the formation of the sub-lines. By this means, the dry film used to form the external connection electrodes can be stuck without causing wrinkles therein, and hence spaces are not formed between the sub-lines and the dry film and between the protective film and the dry film. Thus, plating growth which causes a short between sub-lines can be prevented in forming the external connection electrodes.

Further, according to the method of manufacturing a semiconductor device of the present invention, because the sub-lines are covered by the coating film also in forming the sealing layer, the occurrence of electromigration is prevented, and a short between the sub-lines after sealed can be prevented.

Yet further, according to the semiconductor device manufacturing method of the present invention, after the coating film is formed, most of the sub-line is not exposed, and hence unnecessary particles such as metal chippings can be prevented from sticking to the sub-lines.

With the effects described above, the semiconductor device manufacturing method of the present invention can prevent a short between lines in semiconductor devices and provide semiconductor devices with an improvement in yield and high reliability.

DETAILED DESCRIPTION OF THE INVENTION

An embodiment of the present invention will be described in detail below with reference to the accompanying drawings.

Figure 1:
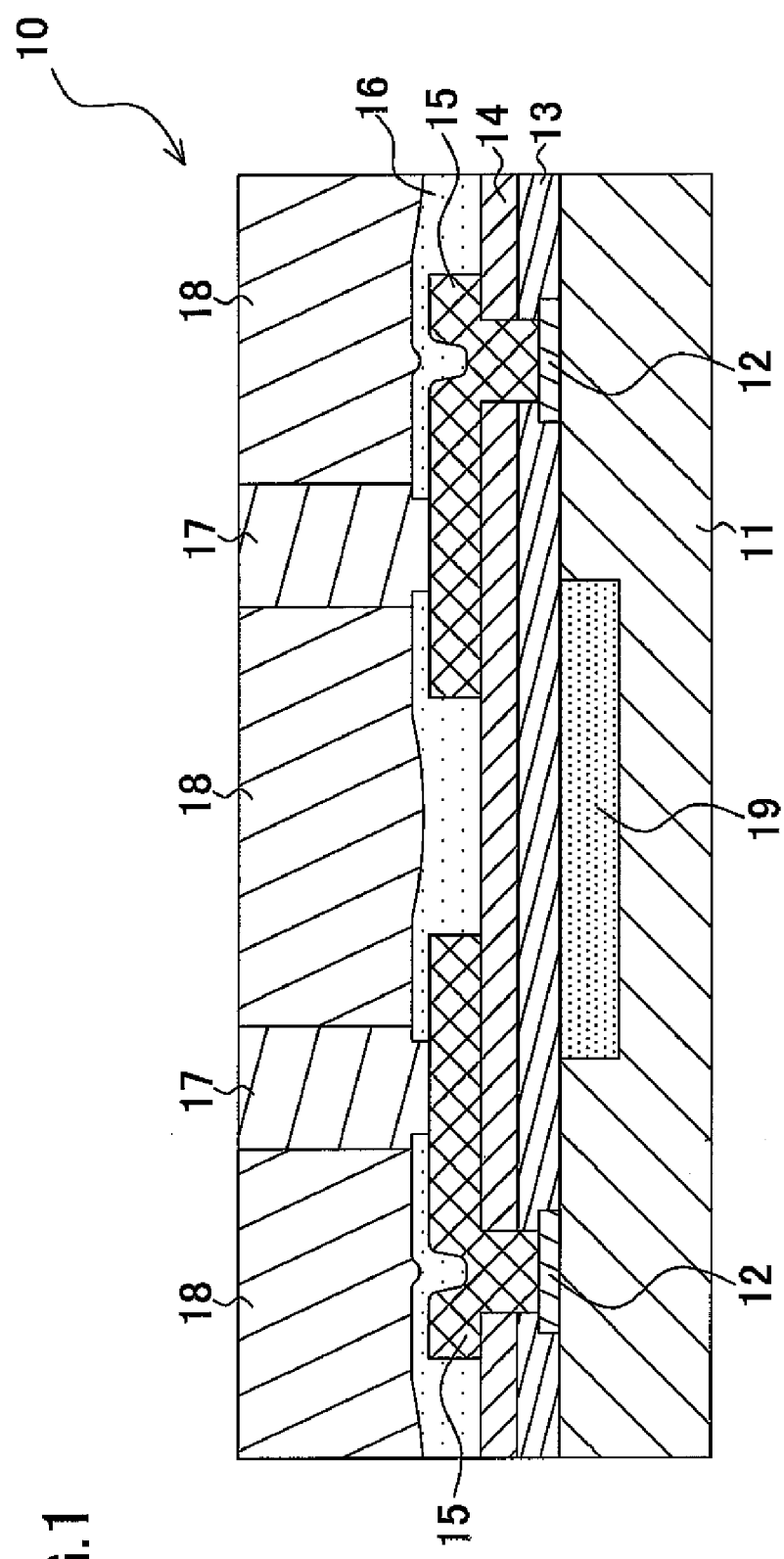
FIG. 1 is a cross-sectional view of a semiconductor device manufactured by a semiconductor device manufacturing method according to an embodiment of the present invention.

First, the structure of a semiconductor device formed by a semiconductor device manufacturing method that is an embodiment of the present invention will be described with reference to FIG. 1. FIG. 1 is a cross-sectional view of the semiconductor device formed by the semiconductor device manufacturing method that is the embodiment of the present invention.

As shown in FIG. 1, the semiconductor device 10 comprises a p-type silicon substrate 11 that is a semiconductor substrate, connection pads 12, an insulating film 13, a protective film 14, redistribution lines (also, referred to as sub-lines or sub-wirings) 15, a coating film 16, column-like external connection electrodes 17 (hereinafter, referred to as post bumps 17), and a sealing layer 18.

An integrated circuit portion 19 having lines or wirings in a desired shape is formed in the p-type silicon substrate 11. The integrated circuit portion 19 is electrically connected to the connection pads 12. The insulating film 13 is formed covering the connection pads 12 and the integrated circuit portion 19. The insulating film 13 is, for example, a silicon oxide film. The protective film 14 is formed covering the insulating film 13. The protective film 14 is made of, e.g., organic resin such as polyimide-based resin or poly-benzo-oxysazole (PBO)-based resin. Further, connection pad exposing holes to expose the connection pads 12 are made in the insulating film 13 and the protective film 14. The redistribution lines 15 are formed on the protective film 14, filling the connection pad exposing holes made to expose the connection pads 12.

The coating film 16 is formed covering the protective film 14 and the redistribution lines 15. The coating film 16 is made of, e.g., organic resin such as polyimide-based resin or PBO-based resin. Redistribution line exposing holes to expose the redistribution lines 15 are made in the coating film 16. The post bumps 17 are formed on the coating film 16, filling the redistribution line exposing holes made to expose the redistribution lines 15. Further, the sealing layer 18 is formed above the redistribution lines 15, covering the side surfaces of the post bumps 17. The sealing layer 18 is made of, e.g., epoxy resin having filler of silica or the like mixed therein.

In the above configuration of the semiconductor device 10, because the post bumps 17 are exposed at the surface of the semiconductor device 10, the integrated circuit portion 19 and the outside of the semiconductor device 10 can be electrically connected via the connection pads 12, the redistribution lines 15, and the post bumps 17. That is, a desired voltage can be externally applied to the integrated circuit portion 19.

Note that a solder ball (not shown) may be provided on the exposed surface of the post bump 17. By forming the solder balls, the semiconductor device 10 can be easily mounted on a mounting board.

Next, the semiconductor device manufacturing method that is the present embodiment will be described with reference to FIGS. 2A-2E to FIGS. 5A-5C. FIGS. 2A-2E to FIGS. 5A-5C are each a cross-sectional view of part of semiconductor devices in the production process according to the embodiment of the present invention.

Figure 2A:
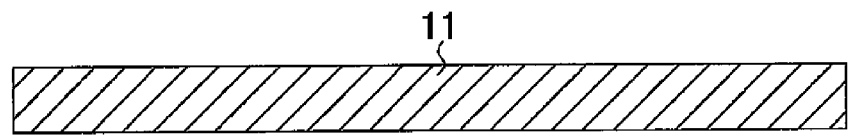
FIGS. 2A-2E are cross-sectional views of part of semiconductor devices in respective manufacturing process steps according to the embodiment of the present invention.
Figure 2B:
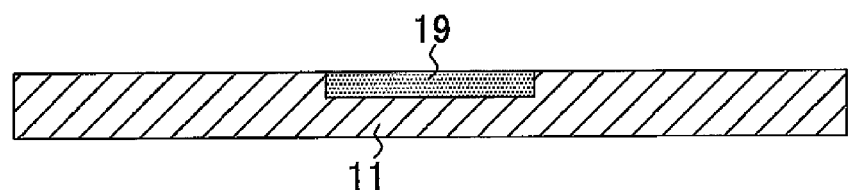

First, the wafer-shaped p-type silicon substrate 11 as a semiconductor substrate is prepared (FIG. 2A). The resistivity of the p-type silicon substrate 11 is, for example, 3 Ω·cm. The integrated circuit portion 19 having lines or wirings in a desired shape is formed in the prepared p-type silicon substrate 11 by a widely known integrated circuit forming technology (FIG. 2B). Although only one integrated circuit portion 19 is shown in FIG. 2B, in reality a plurality of integrated circuit portions 19 are formed in the silicon substrate 11.

Figure 2C:
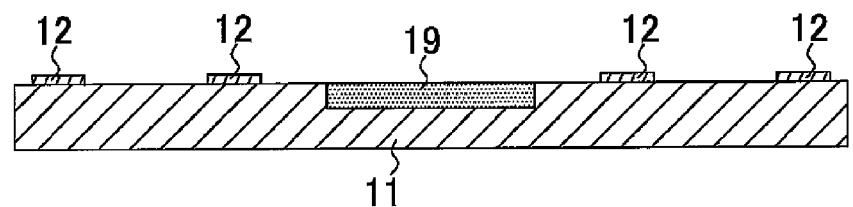

Then, a metal film of Al or Cu is formed on the p-type silicon substrate 11 by a sputtering method. Subsequently, a resist is coated over the metal film. Then the resist is patterned by lithography. With the patterned resist as a mask, dry etching is performed to form the connection pads 12 electrically connected to the integrated circuit portion 19 (FIG. 2C). After the connection pads 12 are formed, the resist is removed.

Figure 2D:
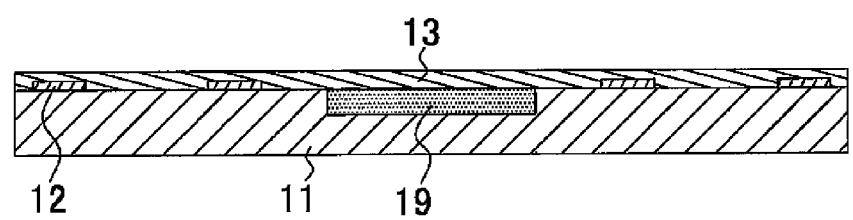
Figure 2E:
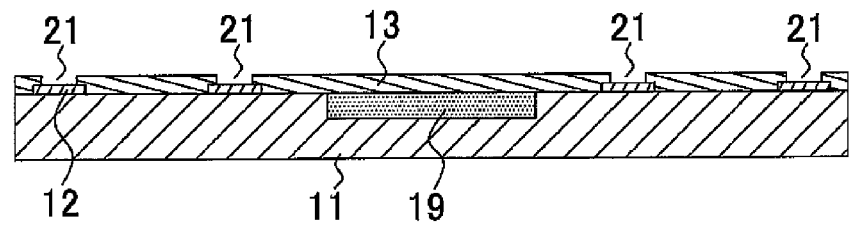

After the connection pads 12 are formed, the insulating film 13 is formed covering the connection pad forming surface of the p-type silicon substrate 11 and the connection pads 12 by a widely known film forming technique such as a thermal oxidation method or a CVD (Chemical Vapor Deposition) method (FIG. 2D). Subsequently, a resist is coated over the insulating film 13. Then the resist is patterned by lithography. With the patterned resist as a mask, dry etching is performed to form first connection pad exposing holes 21 to expose the connection pads 12 in the insulating film 13 (FIG. 2E).

Figure 3A:
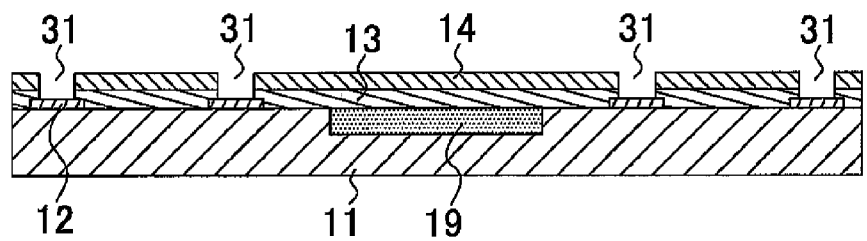
FIGS. 3A-3D are cross-sectional views of part of the semiconductor devices in respective manufacturing process steps according to the embodiment of the present invention.
Figure 3B:
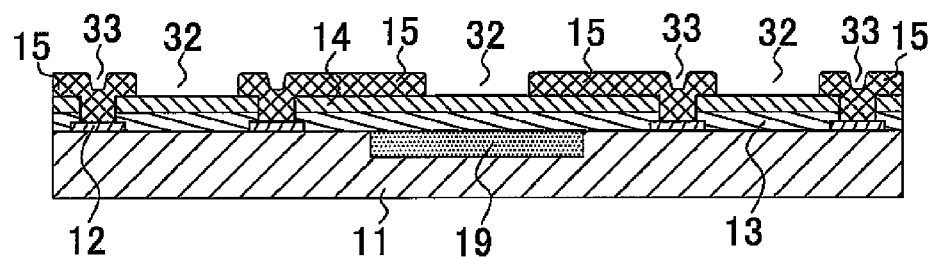

Next, the protective film 14 of liquid polyimide-based resin, PBO-based resin, or the like is formed by spin coating or the like. That is, the insulating film 13 and the protective film 14 are laid one over another on the p-type silicon substrate 11. Then, the protective film 14 is patterned by lithography to form second connection pad exposing holes 31 to expose the connection pads 12 (FIG. 3A). That is, the first connection pad exposing holes 21 and the second connection pad exposing holes 31 extend through the insulating film 13 and the protective film 14 to expose the connection pads 12.

After the second connection pad exposing holes 31 are formed, a metal film (not shown) is formed by a sputtering method on the protective film 14, the inner sides of the first and second connection pad exposing holes 21 and 31, and the exposed connection pads 12. A resist is coated over the formed metal film, and the resist is patterned. The redistribution lines 15 made of Cu are formed by an electrolytic plating method in the openings of the resist formed by the patterning. Thereafter, the metal film and the resist are removed (FIG.

3B). Here, on the surface where the redistribution lines 15 are formed, there formed hollows 32 between the separate redistribution lines 15 and hollows 33 on the surfaces of the redistribution lines 15, the hollows 33 being due to the first and second connection pad exposing holes 21 and 31.

The redistribution lines 15 may be formed by the following method. For example, after the second connection pad exposing holes 31 are formed, a metal film made of Cu is formed over the protective film 14, filling the first and second connection pad exposing holes 21 and 31 by using a widely known plating technique such as non-electrolytic plating or vacuum deposition. Subsequently, a resist is coated over the metal film. Then the resist is patterned by lithography. With the patterned resist as a mask, dry etching is performed to form the redistribution lines 15 of desired shapes filling the first and second connection pad exposing holes 21 and 31. Or, the redistribution lines 15 may be constituted by a metal multilayered film of Ti and Cu formed by a sputtering method.

Figure 3C:
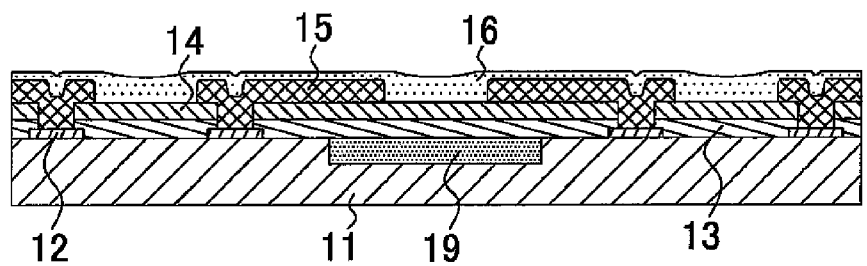

After the redistribution lines 15 are formed, the coating film 16 of liquid polyimide-based resin, PBO-based resin, or the like is coated over the protective film 14 and the redistribution lines 15 by spin coating or the like (FIG. 3C). Here, the thickness of the coating film 16 formed on the redistribution lines 15 is desirably set to be less than the thickness of the redistribution lines 15 so that, even with openings (described later) formed in the coating film 16, the sticking of a dry film (described later) is not affected. By forming the coating film 16 over the protective film 14 and the redistribution lines 15, protrusions and depressions due to the hollows 32 and 33 are alleviated. That is, the coating film 16 has the role to flatten the surface where the redistribution lines 15 are formed (that is, a surface of the semiconductor wafer).

Figure 3D:
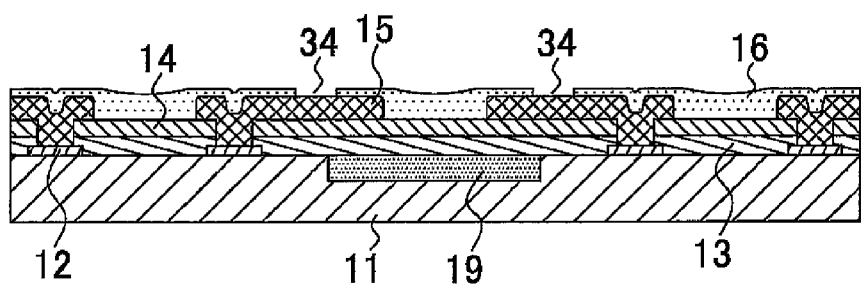

After the coating film 16 is coated, the coating film 16 is patterned by lithography to form redistribution-line exposing holes 34 in the coating film 16. By forming the redistribution-line exposing holes 34, the redistribution lines 15 are partially exposed (FIG. 3D). Note that because the thickness of the coating film 16 formed on the redistribution lines 15 is less than the thickness of the redistribution lines 15, the redistribution-line exposing holes 34 are shallower in depth than the hollows 32 and 33. After the redistribution-line exposing holes 34 are formed, heat treatment at about 300 to 400 degrees centigrade (deg C) is performed on the semiconductor wafer having the redistribution lines 15 formed thereon. By this heat treatment, the coating film 16 is solidified.

Figure 4A:
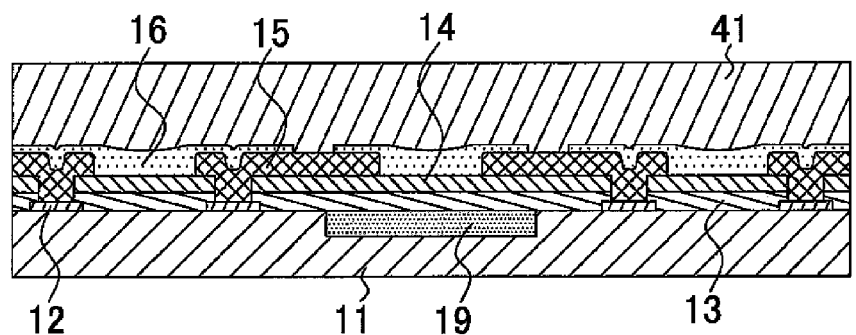
FIGS. 4A-4D are cross-sectional views of part of the semiconductor devices in respective manufacturing process steps according to the embodiment of the present invention.

Then, a dry film 41 is stuck onto the coating film 16 (FIG. 4A). Here, because the surface of the coating film 16 is formed flat, the dry film 41 can be stuck onto the coating film 16 without causing wrinkles or the like in the dry film 41. Further, because the depth of the redistribution-line exposing holes 34 is less than the thickness of the redistribution lines 15, there is no influence on the sticking of the dry film 41, and hence the dry film 41 is stuck to fill the redistribution-line exposing holes 34. That is, by forming the coating film 16 over the redistribution lines 15, the surface to which the dry film 41 is to be stuck is flattened, and hence unnecessary spaces are not formed between the redistribution lines 15 and on the redistribution lines 15. Thus, the dry film 41 can be accurately stuck.

Figure 4B:
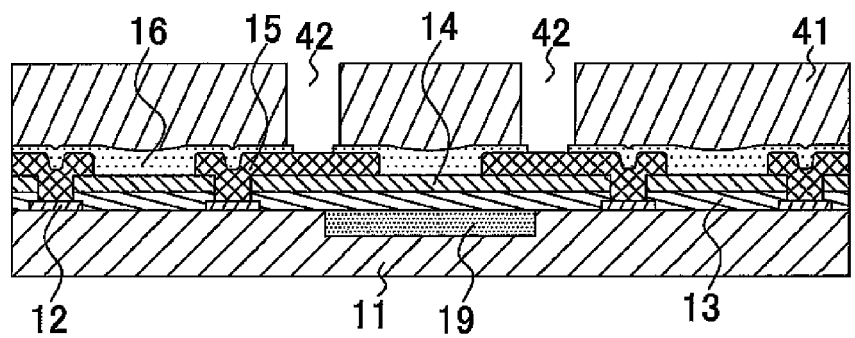

Next, the dry film 41 is patterned by lithography to form communicating holes 42 in the dry film 41 (FIG. 4B). The communicating holes 42 are formed in communication with the redistribution-line exposing holes 34. The communicating holes 42 are formed, for example, to have an opening area larger than that of the redistribution-line exposing holes 34 formed in the coating film 16. By forming the communicating holes 42, parts of the redistribution lines 15 are exposed. That is, by forming the redistribution-line exposing holes 34 and the communicating holes 42, through holes to expose portions of the redistribution lines 15 are formed.

Although in the above production process the redistribution-line exposing holes 34 and the communicating holes 42 are separately formed, without forming the redistribution-line exposing holes 34 subsequent to the formation of the coating film 16, through holes extending through the coating film 16 and the dry film 41 may be formed after the dry film 41 is stuck. Also in this case, the through holes are formed by lithography.

Figure 4C:
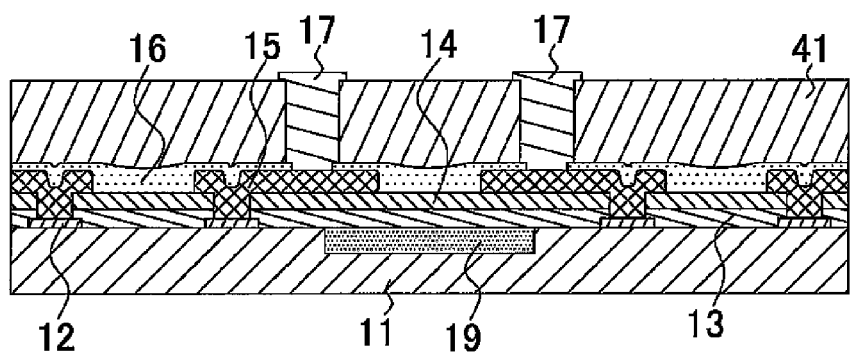
Figure 4D:
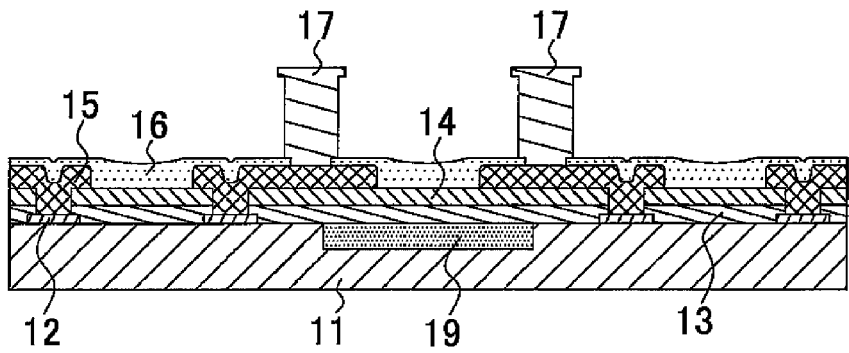

After parts of the redistribution lines 15 are exposed, the post bumps 17 are formed filling the redistribution-line exposing holes 34 and the communicating holes 42 by copper electrolytic plating with the redistribution lines 15 as plating current paths (FIG. 4C). Here, in the above step of sticking the dry film 41, unnecessary spaces are not formed between the redistribution lines 15 and on the redistribution lines 15, and hence unnecessary plating does not grow between the redistribution lines 15 and on the redistribution lines 15. Thus, a short between the redistribution lines can be prevented in this process. Note that the post bumps 17 may be formed by electrolytic plating of a metal other than copper. Subsequently, the dry film 41 is removed to expose the coating film 16 (FIG. 4D).

Figure 5A:
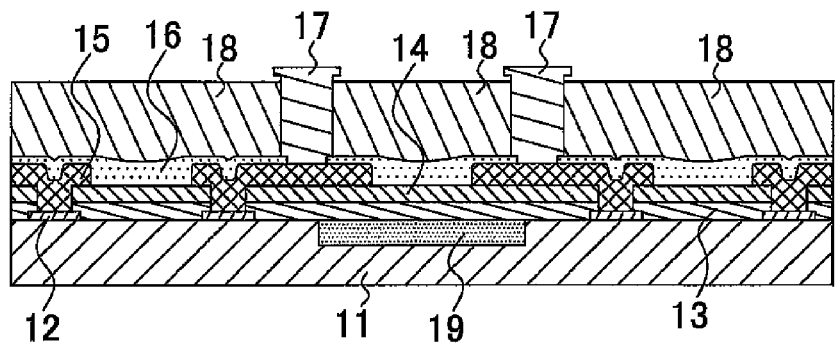
FIGS. 5A-5C are cross-sectional views of part of the semiconductor devices in respective manufacturing process steps according to the embodiment of the present invention.

After the dry film 41 is removed, the sealing layer 18 of epoxy-based resin having filler of silica or the like mixed therein is formed by screen printing, spin coating, or so on (FIG. 5A). The exposed surface of the coating film 16 and the side surfaces of the post bumps 17 are covered by the formed sealing layer 18. Here, because the redistribution lines 15 are covered by the coating film 16, the redistribution lines 15 are not in contact with the sealing layer 18, in this structure. By this means, the occurrence of electromigration that would occur due to the redistribution lines 15 being covered by the sealing layer as in the conventional art is suppressed, and the diffusion of metal ions from the redistribution lines into the sealing layer 18 and the occurrence of an associated short between the redistribution lines are prevented. That is, the coating film 16 functions also as a film to prevent electromigration for the redistribution lines 15.

Figure 5B:
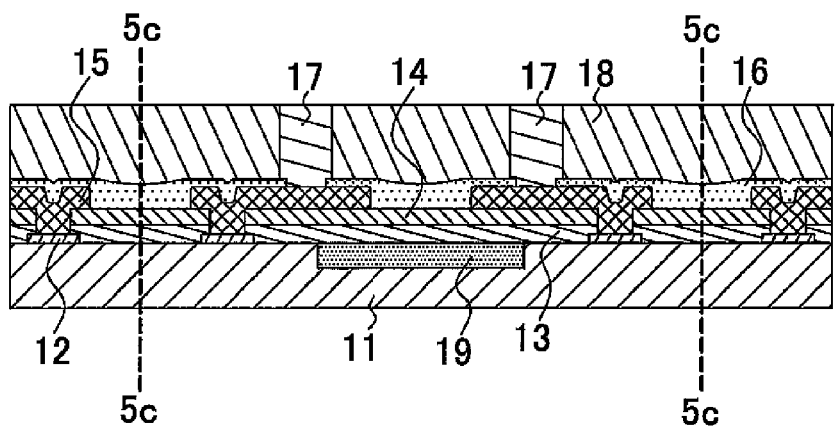

Then, parts of the post bumps 17 and of the sealing layer 18 are removed by a well-known polishing technique method such as a mechanical polishing method using diamond slurry, a chemical mechanical polishing (CMP) method, or a combination thereof. By this removal, the entire surface (i.e., the exposed surfaces of the post bumps 17) of the semiconductor wafer where the sealing layer 18 is formed is flattened (FIG. 5B).

Figure 5C:
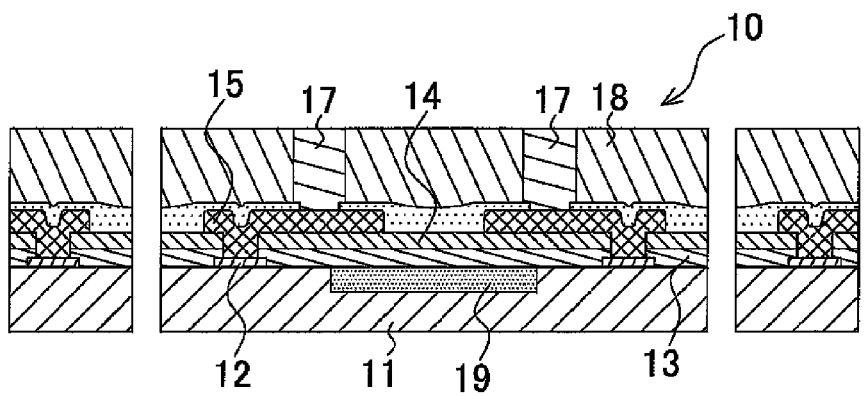

In order to divide the semiconductor wafer formed by undergoing the above process steps into chips, a dedicated scribing apparatus equipped with a diamond scribing tool is used. The semiconductor wafer is mounted in the scribing apparatus and scribed along its scribe lines, thereby being divided into chip units (FIG. 5C). Specifically, lines 5c-5c (indicated by dashed lines) in FIG. 5B correspond to scribe lines. Note that the semiconductor wafer may be divided into chips by dicing using a pulse laser.

By undergoing the above process steps, the semiconductor device 10 of a package size comparable to or slightly larger than the chip size, called a CSP (Chip Size Package), is finished.

As described above, according to the semiconductor device manufacturing method of the present invention, by forming the coating film 16 over the redistribution lines 15 electrically connected via the connection pads 12 to the integrated circuit portion 19 formed in the p-type silicon substrate 11, protrusions and depressions in the semiconductor wafer surface (the redistribution line formed surface) due to the formation of the redistribution lines 15 are alleviated. Thus, the dry film 41 used to form the post bumps 17 can be stuck without causing wrinkles therein, and hence spaces are not formed between the redistribution lines 15 and the dry film 41 and between the protective film 14 and the dry film 41. Therefore, plating growth which causes a short between redistribution lines 15 can be prevented in forming the post bumps 17.

Further, according to the semiconductor device manufacturing method of the present invention, because the redistribution lines 15 are covered by the coating film 16 also in forming the sealing layer 18, the occurrence of electromigration is prevented, and thus a short between the redistribution lines 15 after sealed can be prevented.

Yet further, according to the semiconductor device manufacturing method of the present invention, after the coating film 16 is formed, most of the redistribution line 15 is not exposed, and hence unnecessary particles such as metal chippings can be prevented from sticking to the redistribution lines 15.

With the effects described above, the semiconductor device manufacturing method of the present invention can prevent a short between wirings in semiconductor devices and provide semiconductor devices with an improvement in yield and high reliability.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2008-309765 which is hereby incorporated by reference.

What is claimed is:

1. A method of manufacturing a semiconductor device, comprising:
   a connection pad forming step of forming connection pads on a substrate where an integrated circuit portion having a plurality of wirings are formed, the connection pads being electrically connected to said integrated circuit portion;
   a film forming step of forming an insulating film and stacking a protective film on the insulating film to form a stacked structure having connection pad exposing holes to expose portions of said connection pads therethrough;
   a sub-line forming step of forming sub-lines filling said connection pad exposing holes and covering portions of the exposed surface of said protective film;
   a coating film forming step of forming a coating film covering said sub-lines and said protective film;
   a dry film sticking step of sticking a dry film onto said coating film;
   a through hole forming step of forming through holes extending through said coating film and said dry film to expose parts of said sub-lines;
   an electrode forming step of forming external connection electrodes filling said through holes; and
   a sealing layer forming step of removing said dry film and forming a sealing layer covering said coating film and side surfaces of said external connection electrodes.

2. A method of manufacturing a semiconductor device according to claim 1, wherein in said coating film forming step, liquid resin is coated, thereby forming said coating film.

3. A method of manufacturing a semiconductor device according to claim 2, wherein in said coating film forming step, said liquid resin is coated by a spin coating method.

4. A method of manufacturing a semiconductor device according to claim 3, wherein said coating film is made of organic resin such as polyimide-based resin or poly-benzoxysazole (PBO)-based resin.

5. A method of manufacturing a semiconductor device according to claim 1, wherein said coating film forming step comprises a sub-line exposing hole forming step of forming sub-line exposing holes to expose portions of said sub-lines.

6. A method of manufacturing a semiconductor device according to claim 5, wherein in said through hole forming step, said through holes are formed by forming communicating holes in communication with said sub-line exposing holes in said dry film.

7. A method of manufacturing a semiconductor device according to claim 5, wherein in said coating film forming step, said sub-line exposing holes are formed by exposing said coating film to light.

8. A method of manufacturing a semiconductor device according to claim 2, wherein the thickness of said coating film formed on said sub-lines is less than the thickness of said sub-lines.

9. The method of manufacturing a semiconductor device according to claim 1, wherein the film forming step includes the step of forming holes exposing portions of said connection pads extending through said insulating film; wherein,
   said connection pad exposing holes are formed by forming communicating holes extending through said protective film and in communication with the holes formed in said insulating film.

10. The method of manufacturing a semiconductor device according to claim 5, wherein the sub-line exposing holes formed in said coating film are filled with said external connection electrodes such that said sub-lines are not in contact with said sealing layer.

* * * * *